(12) United States Patent
Hakoo et al.

(10) Patent No.: US 8,185,338 B2
(45) Date of Patent: May 22, 2012

(54) LOW PIN INTERFACE TESTING MODULE

(75) Inventors: Rahul Hakoo, Noida (IN); Chilakala Ravi Kumar, Noida (IN); Deepak Baranwal, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 670 days.

(21) Appl. No.: 12/344,060

(22) Filed: Dec. 24, 2008

(65) Prior Publication Data

US 2009/0228231 A1 Sep. 10, 2009

(30) Foreign Application Priority Data

Dec. 24, 2007 (IN) .......................... 2699/DEL/2007

(51) Int. Cl.
*G01R 31/27* (2006.01)
*G01R 31/02* (2006.01)
*G01R 31/316* (2006.01)
*G01R 31/317* (2006.01)

(52) U.S. Cl. ......... 702/120; 702/117; 702/122; 702/125

(58) Field of Classification Search .................... 702/67, 702/81, 110, 117, 120, 123, 158, 182, 191; 703/23, 25; 710/104, 312
See application file for complete search history.

(56) References Cited

U.S. PATENT DOCUMENTS

| | | | | |
|---|---|---|---|---|
| 5,329,471 A | * | 7/1994 | Swoboda et al. | 703/23 |
| 5,887,146 A | * | 3/1999 | Baxter et al. | 710/104 |
| 6,725,317 B1 | * | 4/2004 | Bouchier et al. | 710/312 |

* cited by examiner

*Primary Examiner* — Michael Nghiem
*Assistant Examiner* — Felix Suarez
(74) *Attorney, Agent, or Firm* — Gardere Wynne Sewell LLP

(57) ABSTRACT

A low pin interface module is provided for testing an integrated circuit. The interface module includes an input-output module, a controlling module, a processing module and a storage module specific to the integrated circuit to be tested. The interface module reduces the required number of hardware pins in the integrated circuit for a standalone testing without limiting the integrated circuit testing features. A methodology and a control mechanism achieved with the interface module can be used for the standalone testing of any integrated circuit without using a Joint European Test Action Group test logic interface JTAG implemented following the IEEE Standard 1149.1-1990. The interface module is not limited by a particular debugging platform and allows access to all test features in the integrated circuit with a reduced number of hardware pins and thereby leading to enhanced testing speeds on a tester in parallel and a shorter time-to-a market cycle and a lower development cost.

16 Claims, 4 Drawing Sheets

LOW PIN INTERFACE TESTING MODULE

PRIORITY CLAIM

The present application claims the benefit of Indian Application for Patent No. 2699/Del/2007 filed Dec. 24, 2007, the disclosure of which is hereby incorporated by reference.

FIELD OF THE INVENTION

The present invention relates to integrated circuits and more specifically to an interface module for testing an integrated circuit that utilizes a fewer number of pins and thereby reduces testing time.

BACKGROUND OF THE INVENTION

In integrated circuits, an interface is used for testing the circuit. Conventionally, the integrated circuits incorporate a JTAG (Joint Test Action Group) test logic interface. The JTAG test logic interface is the IEEE standard 1149.1 compatible device. The IEEE standard 1149.1 compatible device includes an interface having five ports, two ports for control, one port each for an input serial test data and an output serial test data, and an optional fifth port for providing an asynchronous initialization of the test logic. The standard allows test instructions and data to be serially stored into the integrated circuits and enables the subsequent test results to be serially read out.

FIG. 1 illustrates a conventional JTAG test interface architecture. The architecture includes an instruction decoder 126, an instruction register 128, a TAP controller 130, a plurality of test data registers and a test access port TAP. The test access port TAP can provide access to numerous test features built into a component. The architecture is complied with the IEEE standard 1149.1. The plurality of test data registers includes a boundary scan register 118, a bypass register 116 and optional user data registers such as data register 120 and data register 122. The operation and use of the JTAG test interface requires four input connections such as TCK (Test Clock), TDI (Test Data In), TMS (Test Mode Select) and TRST (Test Reset) bar, of the test access port which play a vital role in deciding a testing time for the integrated circuit.

Thus, each hardware pin takes up a physical space on the integrated circuit and the circuit board where the integrated circuit is located. Therefore, the cost associated with the manufacturing of the integrated circuits and circuit boards increases with the increase in the number of hardware pins.

Another approach that has been used for reducing the number of hardware pins is to allow alternate functions to be mapped onto input pins. But this limits a user to stick to a specific functionality at one time. Thus, imposes a problem for the integrated circuits having the low pin count.

Therefore, there is a need for an architecture which requires lesser number of hardware pins so that a greater number of units can be tested in parallel during production time to increase the throughput, and hence reduce the cost of the unit, reduce time to market and increase profit.

SUMMARY OF THE INVENTION

In an embodiment, an architecture for testing an integrated circuit is provided in which the required number of hardware pins on an integrated circuit is reduced without limiting IC testing to particular test features.

In an embodiment, the architecture for testing an integrated circuit reduces testing time.

In yet another embodiment, a reset controller of a lock-unlock generator and instruction register operates on test data signal as a clock providing the option to reset and keep the test system in a locked state at any time.

In yet another embodiment, the architecture includes an interface protocol that provides flow control between an integrated circuit and an external system without requiring additional flow control pins.

In an embodiment, an interface module comprises: an input/output module receiving test data and providing output data; a controlling module operatively coupled to the input/output module for providing at least one control signal; a processing module operatively coupled to the controlling module and the input/output module for executing a plurality of instructions on receiving the at least one control signal; and a storage module operatively coupled to the processing module for one of a scanning in and scanning out the test data based on the plurality of instructions.

A further embodiment provides a method of testing an interface module in an integrated circuit comprising: initializing the interface module using a system reset signal and a system clock signal; generating an unlock signal using $2^n-1$ test clock pulses; applying a test clock signal and a sequence of test data pulses to the interface module for programming an operation code into an instruction register; generating a reset-_counter signal by applying a sequence of pulses to test data signal for resetting a lock-unlock generator; if a present instruction is for scan-in of test data signal, enabling an input buffer by a first enable signal for providing test data to the input buffer; providing the test data and a test clock signal to at least one data register; if a present instruction is not for scan-in of test data signal, enabling an output buffer by a second enable signal for providing an output data through the output buffer; and performing a scan-out operation of the test data.

In an embodiment, apparatus comprises: an input buffer which is input coupled to a test data port to received test data; an output buffer which is output coupled to the test data port to provide output data; a data register having an input coupled to an output of the input buffer and an output coupled to an input of the output buffer; an instruction register having an input coupled to the output of the input buffer and a multibit output; an instruction decoder which decodes the multibit output of the instruction register and generates: an input buffer enable signal applied to the input buffer; an output buffer enable signal applied to the output buffer; and a select signal to select the output of the data register for application to the input of the output buffer.

BRIEF DESCRIPTION OF DRAWINGS

The aforementioned aspects and other features of embodiments of the present invention will be explained in the following description, taken in conjunction with the accompanying drawings, wherein.

DETAILED DESCRIPTION OF THE DRAWINGS

Figure 1:
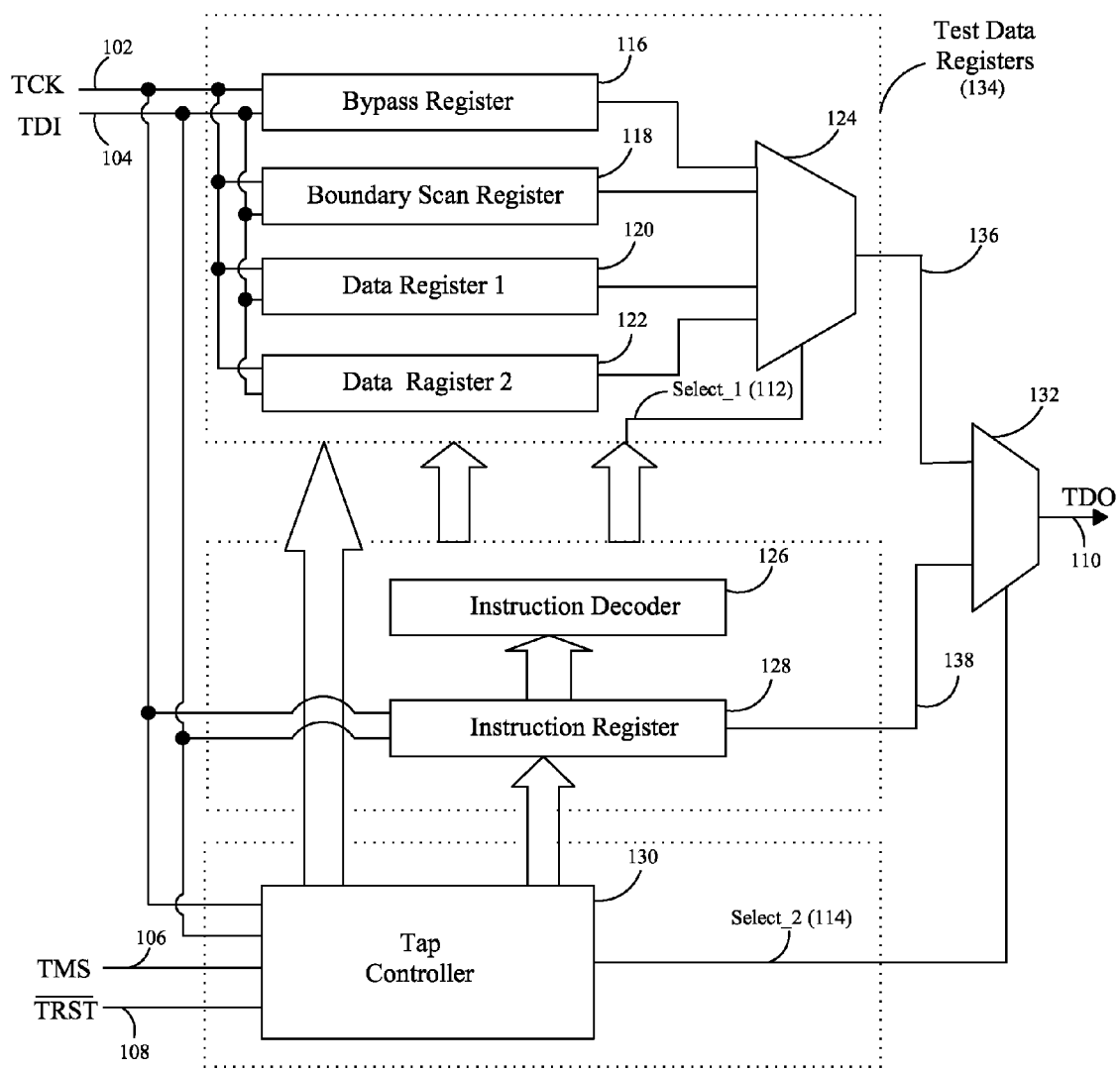
FIG. 1 illustrates a conventional schematic block diagram of a standard JTAG test architecture.

The embodiments are described in detail with reference to the accompanying drawings. However, the present invention is not limited to the embodiments. The present invention can be modified in various forms. The embodiments are only provided to explain more clearly the present invention to the ordinarily skilled in the art of the present invention. In the accompanying drawings, like reference numerals are used to indicate like components.

FIG. 1 illustrating the conventional JTAG test interface architecture is already explained in the background section.

Figure 2:
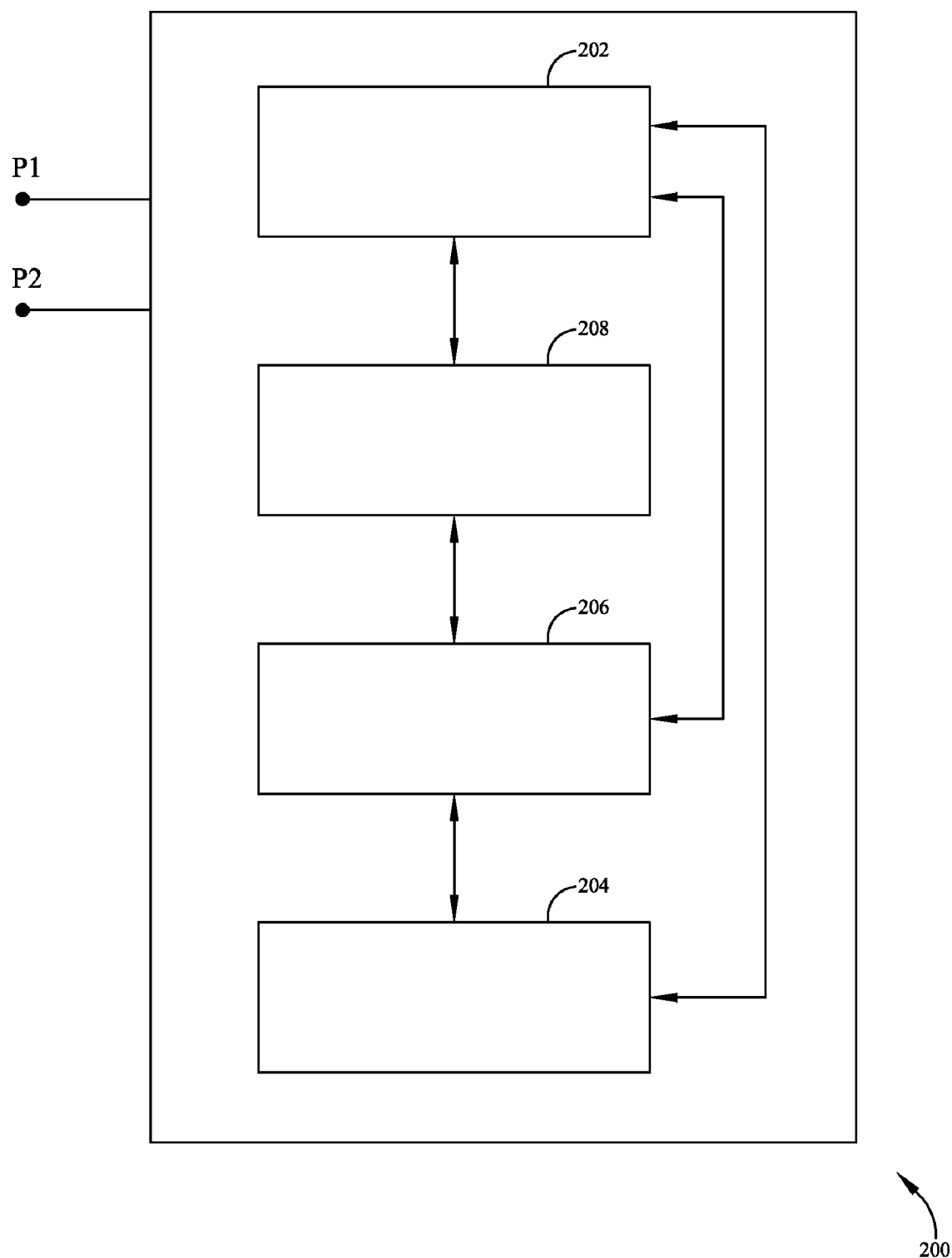
FIG. 2 illustrates a block diagram of an interface module for testing an integrated circuit according to an embodiment.

FIG. 2 illustrates a block diagram of an interface module 200 for testing an integrated circuit according to an embodiment. The interface module 200 includes an input/output module 202, a controlling module 204, a processing module 206 and a storage module 208. The input/output module 202 receives test data from a first pin P1 on receiving an enable signal. The controlling module 204 is coupled to the input/output module 202 for providing at least one control signal. The processing module 206 is coupled to the controlling module 204 for executing a plurality of instructions on receiving the at least one control signal. The processing module 206 is coupled to the input/output module 202 for providing the enable signal. The storage module 208 is coupled to the processing module 206 for either scanning in or scanning out the test data based on the plurality of instructions. The input/output module 202 provides output data at the first pin on receiving an enable signal.

Figure 3:
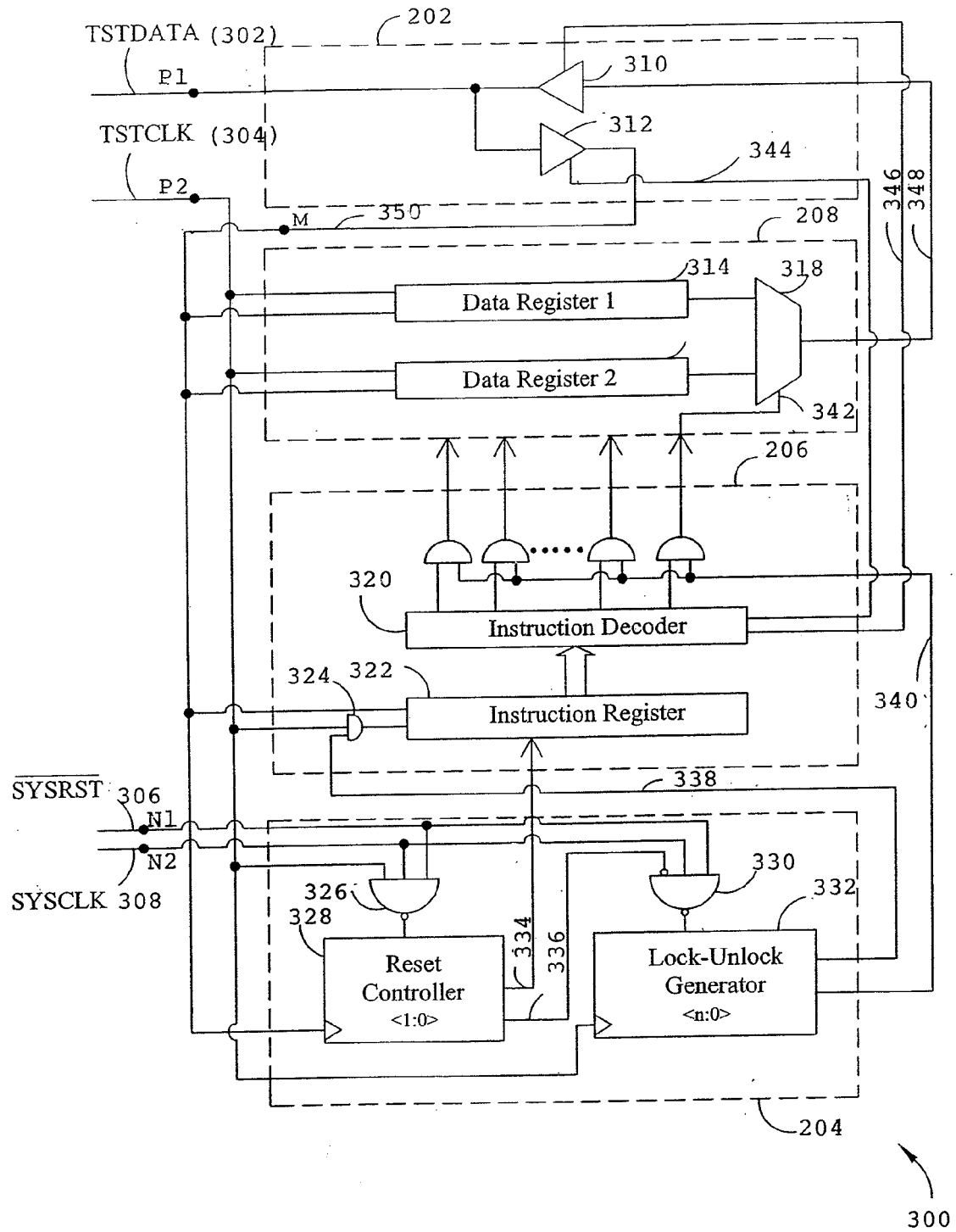
FIG. 3 illustrates a schematic block diagram of an interface module for testing an integrated circuit according to another embodiment.

FIG. 3 illustrates a schematic block diagram of an interface module 300 for testing an integrated circuit according to another embodiment. The input/output module 202 includes an input buffer 312, and an output buffer 310. The controlling module 204 includes a reset controller 328, a lock-unlock generator 332, a first logic gate 326 and a second logic gate 330. The processing module 206 includes an instruction register 322, an instruction decoder 320 and a plurality of logic gates. The storage module 208 includes a multiplexer 318, and at least one data register 314 and 316.

The input buffer 312 is connected between the first pin P1 and an intermediate node M for providing test data 302. The reset controller 328 is a 2-bit counter operatively coupled to a first node N1, a second node N2 and a second pin P2 through the first logic gate 326 for providing a reset signal. In an embodiment, the first logic gate 326 is a NAND gate. The reset controller 328 is asynchronously reset on receiving a low signal from one or more of the three inputs, a system reset signal SYSRST 306 from the first node N1, a system clock signal SYSCLK 308 from the second node N2 and a test clock signal TSTCLK 304 from the second pin P2. The lock-unlock generator 332 is a multiple bit counter connected to the first node N1, the second node N2 and the reset controller 328 through the second logic gate 330 for generating one of a lock signal 340 and an unlock signal 338. In an embodiment, the second logic gate 330 is a NAND gate. A plurality of operation codes are stored in the instruction register 322 for executing the plurality of instructions. The instruction register 322 is coupled to the intermediate node M, the second pin P2 and the lock-unlock generator 332 for receiving the unlock signal 338. The instruction register 322 includes series of shift register bits. The instruction decoder 320 is a combinational logic circuit operatively coupled to the instruction register 322 for decoding the plurality of instructions stored in the instruction register 322. The at least one data register 314, 316 is operatively coupled to the intermediate node M for receiving the test data tstdatain 350 and the second pin P2 for receiving the test clock signal TSTCLK 304. The multiplexer 318 is operatively coupled to the at least one data registers 314, 316 for a scan-out operation of the test data based on the instruction stored in the instruction register 322. The instructions are provided through the instruction decoder 320 and the plurality of logic gates. The plurality of logic gates includes a plurality of AND gates. The output buffer 310 is operatively coupled to the multiplexer for providing the output data tstdataout 348 at the first pin P1 on receiving enabled signal from the instruction decoder 320.

In an embodiment, the lock-unlock generator 332 is an n-bit counter. The lock-unlock generator 332 is controlled by the test clock TSTCLK input 304 and is asynchronously reset when any one of the two inputs, the system clock SYSCLK 308 and the SYSRST 306 goes low. The counter increments on every rising edge of the test clock TSTCLK input 304. In a case, while the value of the counter is less than $2^n-1$, the output signal lock 340 asserts to high and the output signal unlock 338 asserts to low. In another case, when the counter reaches $2^n-1$ value, the lock signal 340 asserts to low and the unlock signal 338 asserts to high. Once the lock is released, the value of the counter does not increment further until it gets reset. This lock-unlock generator 332 can also be asynchronously reset by a second reset signal. The second reset signal is a reset_counter output signal 336 that comes from the reset controller 328. The reset of the lock-unlock generator 332 is controlled through a logic gate 330 by applying the three inputs SYSRST 306, SYSCLK 308 and a reset_counter 336.

The reset controller 328 is clocked with a test data input tstdatain 350 while the test clock input TSTCLK 304 is kept high. The reset controller 328 is a 2-bit counter. The controller state machine 328 gets asynchronously reset as any of the three inputs, system clock SYSCLK 308, system reset SYSRST 306 or test clock TSTCLK 304 is asserted low. The counter is incremented on every rising edge of the tstdatain input 350. When the counter value equals to 2, the output signal reset_counter 336 asserts to high. This resets the lock-unlock generator 332 by retaining the test logic in a locked state. When the value of the counter reaches 3, an output signal, i.e. a first reset signal reset_ireg, 334 is asserted high. The reset_ireg signal 334 is used as an asynchronous reset of the instruction register 322. When the instruction register 322 gets reset, the lock-unlock generator 332 also gets resets, and consequently the test logic is in the locked state. The reset of the reset controller 328 is controlled through the logic gate 326 by the three inputs SYSRST 306, SYSCLK 308 and TSTCLK 304. In an embodiment, the at least one control signal can be the reset_ireg signal 334, the lock signal 340, and the unlock signal 338.

The instruction register 322 is clocked by the test clock input TSTCLK input 304 and is asynchronously reset when the system reset SYSRST 306 is asserted low or the reset_ireg 334 is asserted high by the reset controller 328. The instruction register 322 includes a series of the shift register bits arranged to form a scan path. The instruction register 322 stores the operational code of the instruction. The instruction register 322 will be accessed only when a test system is released from the locked state. This has been executed through an AND gate 324 which masks the test clock TSTCLK 304 when the test logic is in the locked state. During a scan-in operation of the instruction register 322, the unlock output 338 of the lock-unlock generator must be asserted high to release the lock of the test system. Every valid instruction can be scanned in through the tstdatain input 350 by applying appropriate number of clock pulses on the test clock input TSTCLK 304.

The instruction decoder 320 is used for decoding the instructions stored in the instruction register 322 and providing address and control signals needed to access the data registers 314, 316. The instruction decoder 320 is a pure combinational logic circuit. The instruction decoder 320 also generates various control signals. The control signals are required to activate different test features of the integrated circuit. When the test system is in a locked state then outputs of the instruction decoder 320 are available and ensure that the instruction scan operation is completed.

The data registers 314 and 316 coupled between the test data input tstdatain 350 and the test data output tstdataout 348 are separate scan paths. Instructions stored into the instruction register 322 enable one to access any data register 314 or 316. The interface module has only one data pin for executing either a scan-in or a scan-out operation for a particular instruction. When the instruction stored in the instruction register 322 corresponds to the scan-in operation of the data register 314 or 316, the input buffer 312 is enabled. Hence, data is scanned in through the tstdatain input 350 by providing appropriate number of clock pulses on the test clock input TSTCLK 304. When the instruction stored in the instruction register 322 corresponds to the scan-out operation of the data register 314 or 316, select output signal 342 from the instruction decoder 320 selects the output of the particular data register 314 or 316 to drive the tstdataout output 348 of the multiplexer 318 and the required data is scanned out by providing appropriate number of clock pulses on the test clock input TSTCLK 304.

The input buffer 312 includes one input terminal, one output terminal and an enable input buffer terminal. The input terminal is connected to the TSTDATA pin 302, and the output terminal is connected to the tstdatain 350 and node M. The enable input buffer terminal connected to the instruction decoder 320 for receiving an enable input datain_en 344. The input buffer 312 supplies data to the instruction register 322 and the data registers 314, 316. The datain_en signal 344 is asserted high when the unlock output 338 from the lock-unlock generator 332 goes high or the instruction in the instruction register 322 corresponds to the scan-in operation of any data register 314 or 316.

The output buffer 310 includes an input terminal, an output terminal and an enable output buffer terminal. The input terminal is connected to the test data output tstdataout 348, and the output terminal is connected to the first pin P. The enable output buffer terminal is connected to the instruction decoder 320 for receiving dataout_en signal 346. The dataout_en signal 346 is asserted high when the instruction in the instruction register 322 corresponds to the scan-out operation of any test data register 314 or 316. Therefore, for each test data register 314 or 316 separate instructions need to be provided for the scan-in and scan-out operations.

Generally, the protocol for accessing the test data register 314 or 316 for any scan operation or to store a test instruction into the instruction register 322 for activating a test feature of the integrated circuit includes: unlocking the test logic; scan-in of the required instruction; and locking the test logic.

For performing scan operations of the data registers 314, 316, the corresponding instruction for the scan-in or the scan-out operation has to be first stored and then follow the above said protocol. Further, the scan operation on the selected data register 314 or 316 can then be performed. The selected data register 314 or 316 acts like a shift register clocked by the test clock input TSTCLK 304, and shifting the data provided by the test data input tstdatain 350.

Figure 4:
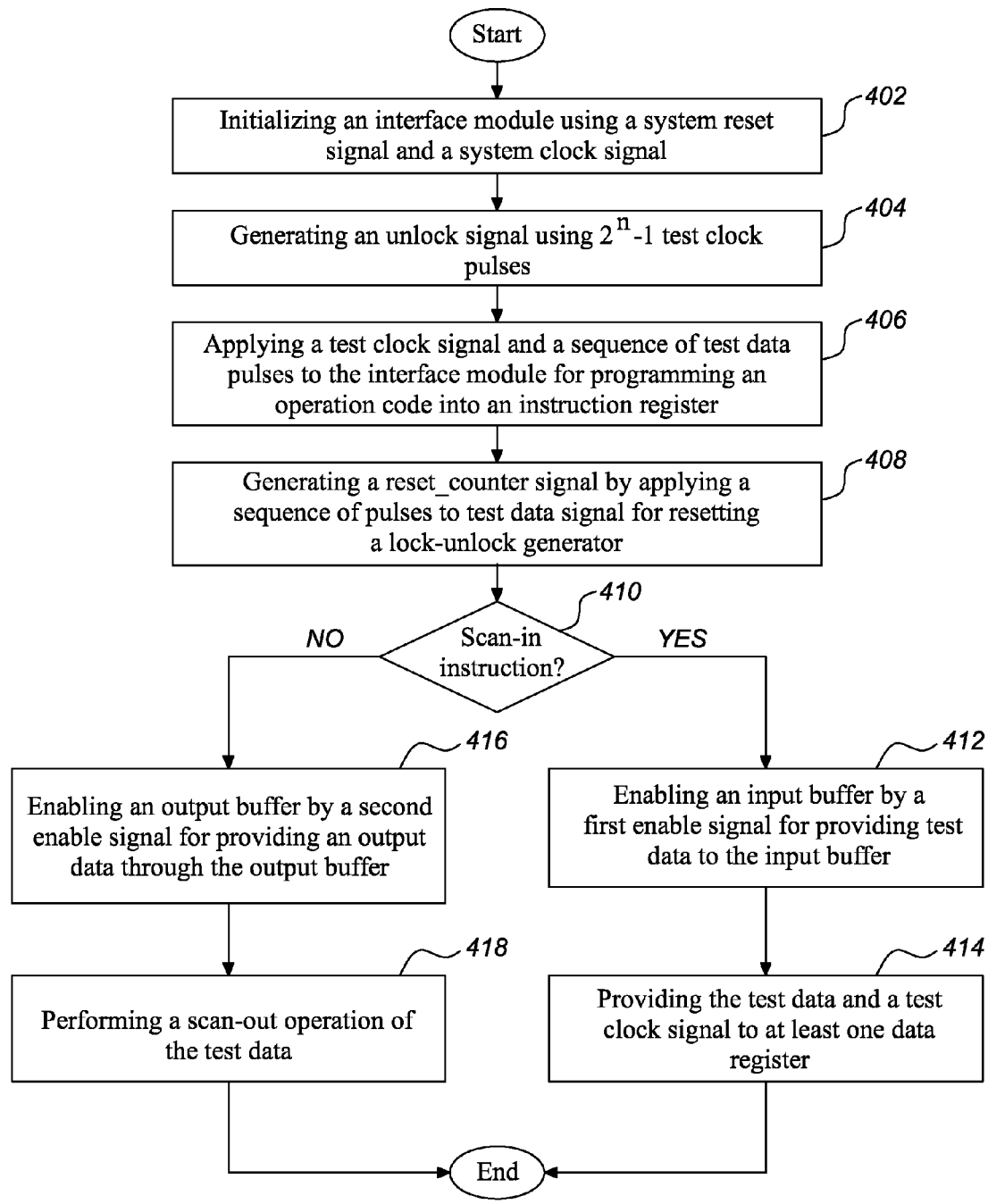
FIG. 4 illustrates a flow diagram of a method for testing an integrated circuit according to an embodiment.

FIG. 4 illustrates a flow diagram of a method of testing an interface module in an integrated circuit according to an embodiment of the present invention. At step 402, a system reset signal and a system clock signal initializes the interface module 300. At step 404, an unlock signal is generated using $2^n-1$ test clock pulses. At step 406, a test clock signal and a sequence of test data signal are applied to the interface module 300 for programming an operation code into an instruction register. At step 408, a reset_counter signal is generated by applying a sequence of pulses to test data signal for resetting a lock-unlock generator 332. At step 410, a decision is taken whether the present instruction is for scan-in of test data signal or not. When the present instruction is for scan-in of test data signal then step 412 and step 414 are executed. At step 412 an input buffer 312 is enabled by a first enable signal for providing test data to the input buffer 312. At step 414, the test data and a test clock signal is provided to at least one data register to program the respective data register. When the present instruction is not for the scan-in of test data signal then step 416 and step 418 are executed. At step 416, an output buffer 310 is enabled by a second enable signal for providing an output data through the output buffer 310. At step 418, a scan-out operation of the test data is performed.

The embodiments are related to an interface module and can be used in various applications, such as embedded systems for testing integrated circuits. Further, embodiments can be used for debugging of the system.

The embodiments describe test architecture for integrated circuits offers many advantages. Firstly, the controllability on the test logic is achieved using only one test data pin and one test clock pin without having a separate test control pin. Secondly, the test data pin is used for the scan-in and scan-out operations and thus one more pin is saved which is required for the scan operations otherwise. Thus, the one embodiment of the new test architecture can be used for the integrated circuit having a reduced number of pins. Thirdly, a greater number of systems can be tested in parallel because of the low pin-count required. Thus the present test architecture saves test time of an integrated circuit by a large extent.

Although the disclosure of the interface module and method has been described in connection with the embodiments illustrated in the accompanying drawings, it is not limited thereto. It will be apparent to those skilled in the art that various substitutions, modifications and changes may be made thereto without departing from the scope and spirit of the disclosure.

What is claimed is:

1. An interface module comprising:
   a test data line configurable in an input mode to receive test input data and in an output mode to output test output data;
   a test clock line configured to receive a test clock signal;
   a controlling module operatively coupled to the test clock line and operable in response receipt of the test clock signal to generate an unlock signal and a lock signal;
   a processing module operatively coupled to the controlling module and including an instruction register and an instruction decoder, the processing module operable in response to the unlock signal to load an instruction in the instruction register, said instruction decoded by the instruction decoder to generate test control and test data line configuration signals, and further operable in response to the lock signal to enable output of the generated test control signals;
   wherein the test data line is configured in the input mode and output mode in response to said test data line configuration signal; and
   a storage module operatively coupled to the test data line and operable in response to the test control signal and test clock signal to scan test input data from the test data line into the storage module based on the decoded instruction and scan test output data from the storage module to the test data line based on the decoded instruction.

2. The interface module of claim 1, further comprising an input/output module which comprises:
- an input buffer having an input operatively coupled to said test data line and having an output operatively coupled to an intermediate node, said input buffer providing the test input data to the intermediate node in response to said test data line configuration signal; and
- an output buffer having an input operatively coupled to an output of the storage module and having an output operatively coupled to said test data line for providing the test output data in response to said test data line configuration signal.

3. The interface module of claim 1, wherein said controlling module comprises:
- a reset controller operatively coupled to a first node, a second node and said test clock line through a first logic gate, said reset controller providing a reset signal; and
- a lock-unlock generator operatively coupled to the first node, the second node and to receive the reset signal through a second logic gate, said lock-unlock generator generating the one of a lock signal and the an unlock signal.

4. The interface module of claim 3, wherein said reset controller is operatively coupled to said instruction register, said reset signal comprising a first reset signal operable to reset the instruction register.

5. The interface module of claim 3, wherein said reset controller is operatively coupled to the lock-unlock generator, said reset signal comprising a second reset signal operable to reset the lock-unlock generator.

6. The interface module of claim 3, wherein said lock-unlock generator is operatively coupled to said test clock line to receive said test clock signal.

7. The interface module of claim 1, wherein said storage module comprises:
- at least one data register configured to receive the test input data and said test clock signal; and
- a multiplexer operatively coupled to the at least one data register and configured to scan out the test output data based on the decoded instruction.

8. Apparatus, comprising:
- an input buffer having an input connected to a test data line configured to receive test input data;
- an output buffer having an output connected to the test data line configured to output test output data;
- a data register having an input coupled to an output of the input buffer and an output coupled to an input of the output buffer;
- an unlock-lock generator configured to receive a test clock signal and in response thereto generate an unlock signal and a lock signal;
- an instruction register having an input coupled to the output of the input buffer and a multibit output, the instruction register operable in response to the unlock signal to receive an instruction from the input buffer;
- an instruction decoder operable to decode the multibit output of the instruction register and generate test control and test data line configuration signals, the test data line configuration signals including an input buffer enable signal applied to enable operation of the input buffer to pass test input data received from the test data line to the data register and an output buffer enable signal applied to enable operation of the output buffer to pass test output data received from the data register to the test data line, the test control signal including a select signal to select the output of the data register for application to the input of the output buffer in response to the lock signal.

9. The apparatus of claim 8, further including a clock input for receiving said test clock signal for application to the data register and the instruction register.

10. The apparatus of claim 9, further comprising:
- a reset controller having a first input coupled to the input buffer output and a first reset signal output for resetting the instruction register; and
- said lock-unlock generator having a first input coupled to receive the test clock signal and a first locking control output for unlocking the instruction register and a second locking control output for locking the select signal output from the instruction decoder;
- the reset controller further including a second reset signal output to the lock-unlock generator.

11. The apparatus of claim 8, further including:
- a second data register having an input coupled to an output of the input buffer and an output coupled to an input of the output buffer; and
- a multiplexer whose inputs are coupled to the outputs of the data registers and a selection input for selecting output from one of the data registers for application to the input of the output buffer;
- the selection input receiving the select signal output from the instruction decoder.

12. The apparatus of claim 10, further comprising:
- a system reset input;
- a system clock input;
- a first logic circuit for logically combining signals from the test clock input, system reset input and system clock input to generate a first logic signal for application to reset a counter within the reset controller; and
- a second logic circuit for logically combining signals from the test clock input, system reset input and second reset signal output for application to reset a counter within the lock-unlock generator.

13. A method, comprising:
- generating an unlock signal in response to receipt of a plurality of test clock pulses on a test clock line;
- loading an instruction into an instruction register in response to the unlock signal;
- decoding the instruction to generate test control and test data line configuration signals;
- generating a lock signal in response to receipt of the plurality of test clock pulses on the test clock line;
- if the decoded instruction is for scan-in of test input data, and in response to the lock signal, enabling an input buffer coupled to a test data line using the test data line configuration signal to receive test input data from the test data line and pass the received test input data to a storage module; and
- if the decoded instruction is for scan-out of test output data, and in response to the lock signal, enabling an output buffer coupled to said test data line using the test data line configuration signal to output test output data from the storage module and pass the test output data to said test data line.

14. Apparatus, comprising:
- a test data line;
- an input buffer having an input connected to a test data line;
- an output buffer having an output connected to the test data line;
- a test clock line configured to receive a test clock signal;
- a controlling module operatively coupled to the test clock line and operable in response receipt of the test clock signal to generate an unlock signal and then generate a lock signal;

a processing module operatively coupled to the controlling module and including an instruction register and an instruction decoder, the processing module operable in response to the unlock signal to load an instruction in the instruction register, said instruction decoded by the instruction decoder to generate test control signals and generate buffer enable signals;

a storage module including a plurality of data registers; and logic circuitry responsive to the lock signal and operable to pass the test control signals to the storage module;

wherein the buffer enable signals include an input buffer enable signal operable to enable the input buffer to pass test input data from the test data line to one of the data registers selected by the test control signals; and wherein the buffer enable signals include an output buffer enable signal operable to enable the output buffer to pass test output data from one of the data registers to the test data line, wherein said one of the data registers is selected by the test control signals.

15. The apparatus of claim 14, wherein the storage module further comprises a multiplexer having data inputs coupled to outputs of the data registers, an output coupled to an input of the output buffer and a control input, and wherein the test control signals include a select signal applied to the control input of the multiplexer to select one of the data registers to output test output data.

16. The apparatus of claim 14, wherein the controlling module comprises:

an unlock-lock generator clocked by the test clock signal from the test clock line, the unlock-lock generator having an unlock-lock generator counter, and the unlock-lock generator configured to generate the lock signal if the unlock-lock generator counter is less than a first value and further generate the unlock signal if the unlock-lock generator counter exceeds the first value; and a reset controller clocked by data received from the test data line, the reset controller resetting the unlock-lock generator counter when a reset controller counter reaches a second value and further resetting the instruction register when the reset controller counter reaches a third value.

* * * * *

UNITED STATES PATENT AND TRADEMARK OFFICE
CERTIFICATE OF CORRECTION

| | |
|---|---|
| PATENT NO. | : 8,185,338 B2 |
| APPLICATION NO. | : 12/344060 |
| DATED | : May 22, 2012 |
| INVENTOR(S) | : Rahul Hakoo et al. |

It is certified that error appears in the above-identified patent and that said Letters Patent is hereby corrected as shown below:

Column 7, claim 3, lines 21-22, replace the phrase [generating the one of a lock signal and the an unlock signal] with the phrase -- generating the lock signal and the unlock signal --.

Signed and Sealed this
Third Day of July, 2012

David J. Kappos
*Director of the United States Patent and Trademark Office*